United States Patent
Holmes et al.

(10) Patent No.: US 11,462,997 B2
(45) Date of Patent: Oct. 4, 2022

(54) DC TO DC CONVERTER FOR A VEHICLE ALTERNATOR

(71) Applicant: Milspec Technologies Pty Ltd, Albury (AU)

(72) Inventors: Donald Grahame Holmes, Victoria (AU); Patrick McGoldrick, Victoria (AU); Andrew McIver, Victoria (AU); Noel Gordon, New South Wales (AU); Bradley Hewitt, New South Wales (AU)

(73) Assignee: MILSPEC TECHNOLOGIES PTY LTD, Albury (AU)

( * ) Notice: Subject to any disclaimer, the term of this patent is extended or adjusted under 35 U.S.C. 154(b) by 0 days.

(21) Appl. No.: 17/273,028

(22) PCT Filed: Sep. 2, 2019

(86) PCT No.: PCT/AU2019/050929
§ 371 (c)(1),
(2) Date: Mar. 3, 2021

(87) PCT Pub. No.: WO2020/047583
PCT Pub. Date: Mar. 12, 2020

(65) Prior Publication Data
US 2021/0328505 A1 Oct. 21, 2021

(30) Foreign Application Priority Data
Sep. 3, 2018 (AU) .................................. 2018903251

(51) Int. Cl.
*H02M 1/44* (2007.01)
*H02M 3/155* (2006.01)
*H02P 9/02* (2006.01)

(52) U.S. Cl.
CPC ............. *H02M 1/44* (2013.01); *H02M 3/155* (2013.01); *H02P 9/02* (2013.01)

(58) Field of Classification Search
None
See application file for complete search history.

(56) References Cited

U.S. PATENT DOCUMENTS 4,827,393 A 5/1989 Clark
5,406,471 A 4/1995 Yamanaka
(Continued)

FOREIGN PATENT DOCUMENTS

EP 0765021 3/1997
WO 2018148218 8/2018

OTHER PUBLICATIONS

Seliger et al., "Isolated High Voltage DC/DC Converter for Auxiliary Power Supply in Commercial Vehicles", Conference on Power Conversion and Intelligent Motion (PCIM), Nuremberg, Germany, May 2013 (8 pages).

(Continued)

*Primary Examiner* — Jeffery S Zweizig
(74) *Attorney, Agent, or Firm* — Esplin & Associates, PC

(57) ABSTRACT

A direct-current (DC) converter for a permanent-magnet (PM) alternator for a vehicle, the DC converter including one or more pairs of step-down converters that are electrically in parallel operating at a fundamental switching frequency, wherein the two step-down converters in each pair are arranged to be switched out of phase, and wherein the two step-down converters in each pair are arranged adjacent to each other to mitigate conducted electromagnetic interference (EMI).

21 Claims, 9 Drawing Sheets

(56) References Cited

U.S. PATENT DOCUMENTS

| | | | |
|---|---|---|---|
| 5,942,818 A | 8/1999 | Satoh | |
| 7,138,789 B2 * | 11/2006 | Moussaoui | H02M 3/1588 |
| | | | 323/272 |
| 9,673,697 B2 * | 6/2017 | McCune, Jr. | H02M 7/2176 |
| 9,684,320 B2 * | 6/2017 | Shin | H02M 3/1584 |
| 9,729,059 B1 * | 8/2017 | Parto | H02M 7/003 |
| 10,050,620 B2 * | 8/2018 | Sato | H03K 17/567 |
| 2005/0146308 A1 | 7/2005 | Quazi | |
| 2006/0038406 A1 | 2/2006 | Hino | |
| 2007/0268004 A1 | 11/2007 | Rozman | |
| 2013/0193755 A1 | 8/2013 | Chang | |

OTHER PUBLICATIONS

International Search Report, PCT Application No. PCT/AU2019/050929, dated Nov. 14, 2019 (6 page).

Noon J P et al, "Design of a Multi-Module, Multi-Phase Battery Charger for the NASA EOS Space Platform Testbed", Aerospace Power, San Diego, Aug. 3-7, 1992, Institute of Electrical and Electronics Engineers, (Aug. 3, 1992), vol. 1, pp. 1.73-1.78, XP000366011.

* cited by examiner

DC TO DC CONVERTER FOR A VEHICLE ALTERNATOR

TECHNICAL FIELD

The present disclosure relates to vehicle alternators that generate direct current (DC) electrical power from vehicle engines, including vehicle alternators with permanent magnets (PMs), paralleled DC-to-DC convertors (also referred to herein as "DC convertors") for such PM alternators (which may be referred to as a "magnetos"), and to methods of operating such DC convertors. The present disclosure also relates to methods of operating and forming such DC convertors

BACKGROUND

An alternator is an electrical device that generates alternating current (AC), which can be converted to direct current (DC) electrical power for a vehicle engine. Conventional alternators include field windings that carry field current to generate a magnetic field through which conductors of the alternator pass to generate an AC voltage. The AC output voltage from an alternator depends on its rotational speed, which is related to the vehicle engine speed. The AC is converted to DC using a rectifier circuit. To keep the DC output voltage constant, which is a requirement of many vehicle electrical systems, the field current is controlled to compensate for changes in vehicle engine speed.

It may be desirable in some applications to use PM alternators, but these do not have field windings. Instead PM alternators may include DC-to-DC converters to compensate for the changing output voltages from the rotating elements: for example, if the rotating elements generate an undesirably high DC output voltage, the DC converter could step it down to a lower DC output voltage. However, in some environments, e.g., those where there are limitations on electromagnetic interference (EMI), in-vehicle space, high operating temperatures and/or vibration tolerance, the output power available from existing alternators and DC convertors may be insufficient for some applications, or alternatively, at higher power levels, the EMI interference generated may be too high, or the allowable temperature range may be too low.

It is desired to address or ameliorate one or more of the disadvantages or limitations associated with the prior art, or to at least achieve an effective alternative.

SUMMARY

In accordance with the present disclosure there is provided a direct-current (DC) converter for a permanent-magnet (PM) alternator for a vehicle, the DC converter including one or more pairs of step-down converters (referred to as "step-down converters cells") that are electrically in parallel operating at a fundamental switching frequency, wherein the two step-down converters in each pair are arranged to be switched out of phase, and wherein the two step-down converters in each pair are arranged adjacent to each other to mitigate conducted (i.e., conductive, or non-radiative) electromagnetic interference (EMI).

The two step-down converters in each pair are arranged to be switched a half cycle out of phase by configuration of switching control electronics of the DC converter.

The two step-down converters in each pair are physically arranged adjacent to each other to mitigate conducted EMI at the odd harmonics of their fundamental switching frequency. Each step-down converter cell has a semiconductor power transistor and a semiconductor power diode, arranged such that the power diodes are located between the power transistors of the two step-down converters in each pair. The physical interconnections between the semiconductor devices of the two step-down converters in each pair are arranged to achieve reflection symmetry (about the central power diode device) to reduce odd harmonic circulating currents and thus mitigate odd harmonics of the fundamental switching frequency.

Two pairs of the step-down converters are then replicated adjacent to each other to form a quad to mitigate conducted EMI at the second, sixth, tenth, fourteenth and/or eighteenth (and so on), harmonics of the fundamental switching frequency (i.e., at the "2+n4"-th harmonics, where "n" is a non-negative integer). The physical arrangements of each of the two pairs of the quad are identical, so the pairs in each quad have translation symmetry.

The two pairs of step-down converters in each quad are arranged to be switched out of phase (providing a phase difference between the pairs) by configuration of switching control electronics of the DC converter, including a quarter cycle out of phase.

Two of the quads are then replicated adjacent to each other to form an octet to mitigate conducted EMI at the fourth, twelfth, twentieth and so on, harmonics of the fundamental switching frequency (i.e., at the "4+n8"-th harmonics, where "n" is a non-negative integer). The physical arrangements of each of the two quads of the octet are identical, so the quads in the octet have translation symmetry.

The step-down converters in each quad are arranged to be switched out of phase between each quad by configuration of the switching control electronics of the DC converter, including an eighth cycle out of phase.

The DC converter includes a loop inductor formed by output conductors extending from the step-down converters to DC output terminals for the vehicle, wherein the loop inductor provides an output filter that mitigates conducted EMI, including at and above the eighth harmonic of the fundamental switching frequency. The output filter includes one or more output filter capacitors that cooperate with the loop inductor to provide the output filtering function (i.e., the output filter).

All of the step-down converters are electrically isolated from electrical ground at the fundamental switching frequency.

The fundamental switching frequency may be between 15 kHz and 50 kHz, including between 25 kHz and 40 kHz, including between 30 kHz and 35 kHz, including at 35 kHz.

In accordance with the present disclosure there is provided a direct-current (DC) converter for a permanent-magnet (PM) alternator for a vehicle, the DC converter including multiple step-down converters that are electrically connected in parallel, wherein each step-down converter includes an inductor component and switching control electronics encased in potting material, wherein the DC converter includes a liquid cold plate in the potting material between the inductor component and the switching control electronics to mitigate overheating of the inductor component and the switching control electronics.

The DC converter includes one or more thermally conductive fins extending in the potting material from the liquid cold plate along one or more sides of the inductor component such that the inductor component has at least two sides facing the liquid cold plate or the thermally conductive fins.

The thermally conductive fins effectively increase the liquid cold plate's thermal surface area facing the inductor component.

The DC converter includes one or more isolated thermally conductive elements in the potting material between the thermally conductive fins and the inductor component to improve thermal conduction between the inductor component and the liquid cold plate, wherein the isolated thermally conductive elements are electrically isolated from the thermally conductive fins by the potting material. The isolated thermally conductive elements extend longitudinally generally parallel to the thermally conductive fins. At least one of the isolated thermally conductive elements has a proximal end that is adjacent to the liquid cold plate, and the proximal end has an expanded transverse face relative to middle portions of the isolated thermally conductive element to increase the isolated thermally conductive element's thermal surface area facing the liquid cold plate.

The present disclosure also provides the permanent-magnet (PM) alternator for a vehicle, the PM alternator including the direct-current (DC) converter.

The present disclosure also provides a method of operating a direct-current (DC) converter for a permanent-magnet (PM) alternator for a vehicle, the DC converter including multiple pairs of step-down converters that are electrically in parallel, wherein the two step-down converters in each pair are arranged adjacent to each other, including switching the two step-down converters in each pair out of phase to mitigate conducted electromagnetic interference (EMI).

The present disclosure also provides a method of forming a direct-current (DC) converter for a permanent-magnet (PM) alternator for a vehicle, including:

arranging multiple step-down converters electrically in parallel, wherein each step-down converter includes an inductor component and switching control electronics;

arranging a liquid cold plate between the inductor components and the switching control electronics to mitigate overheating of the inductor components and the switching control electronics; and encasing the liquid cold plate, the inductor components and the switching control electronics in potting material.

BRIEF DESCRIPTION OF THE DRAWINGS

Some embodiments are hereinafter further described, by way of non-limiting example only, with reference to the accompanying drawings, in which.

DETAILED DESCRIPTION

Figure 1:
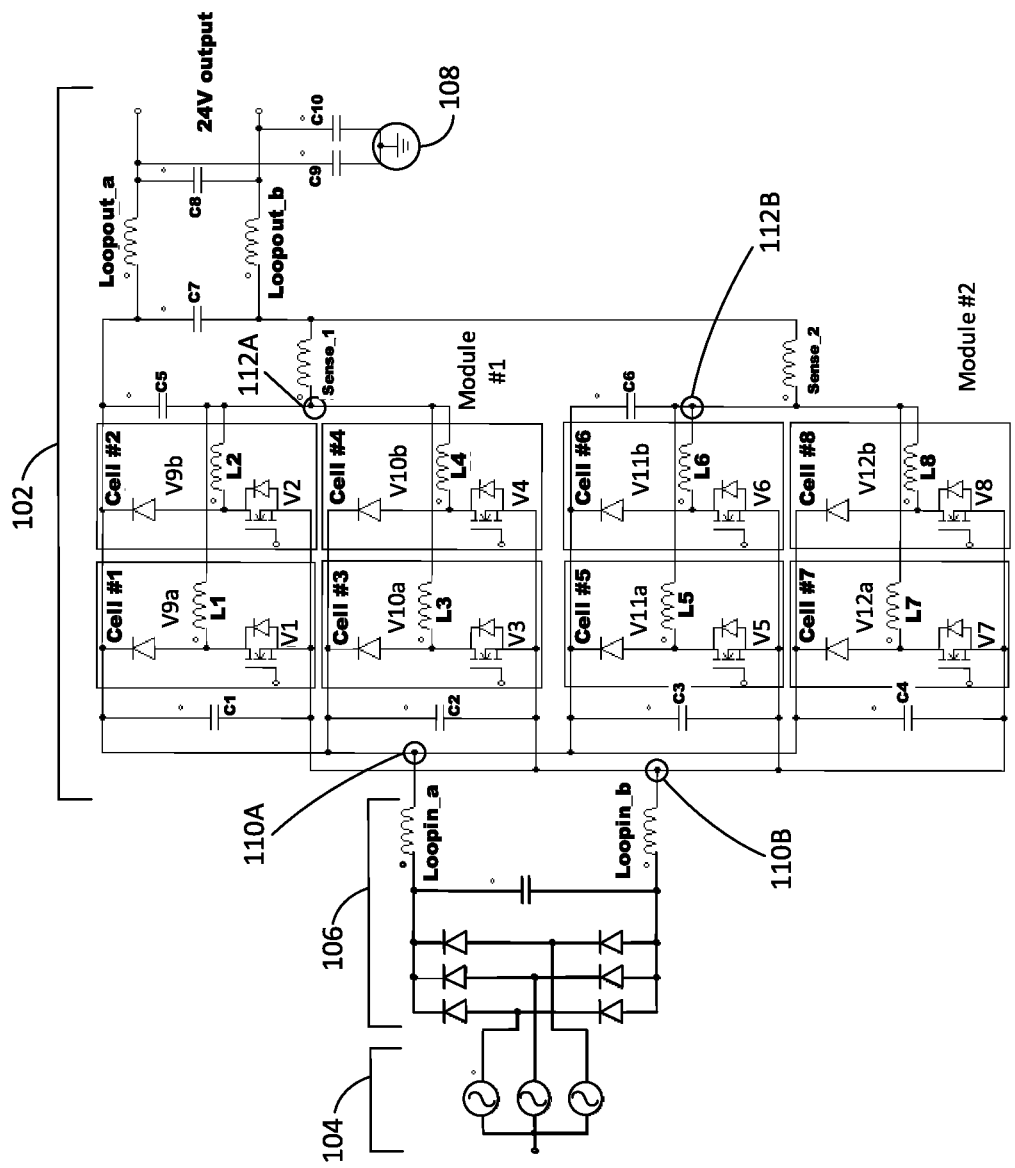
FIG. 1 is an electronic circuit diagram of a permanent-magnet (PM) alternator for a vehicle with a rectifier and a direct-current (DC) converter.

With reference to FIG. 1, described herein is a direct-current (DC) converter 102 for a permanent-magnet (PM) alternator 104 for a vehicle. Between the PM alternator 104 and the DC converter 102 is a rectifier circuit 106 that generates an input DC voltage for the DC converter 102 from the AC generated by the PM alternator 104 when driven by the vehicle's motor.

As shown in FIG. 1, the DC converter 102 includes a plurality of pairs of step-down converters that are electrically connected in parallel. The step-down converters (also known as "buck converters") are referred to as "cells". There are eight step-down converters shown in FIG. 1, labelled "cell #1" to "cell #8".

Figure 2:
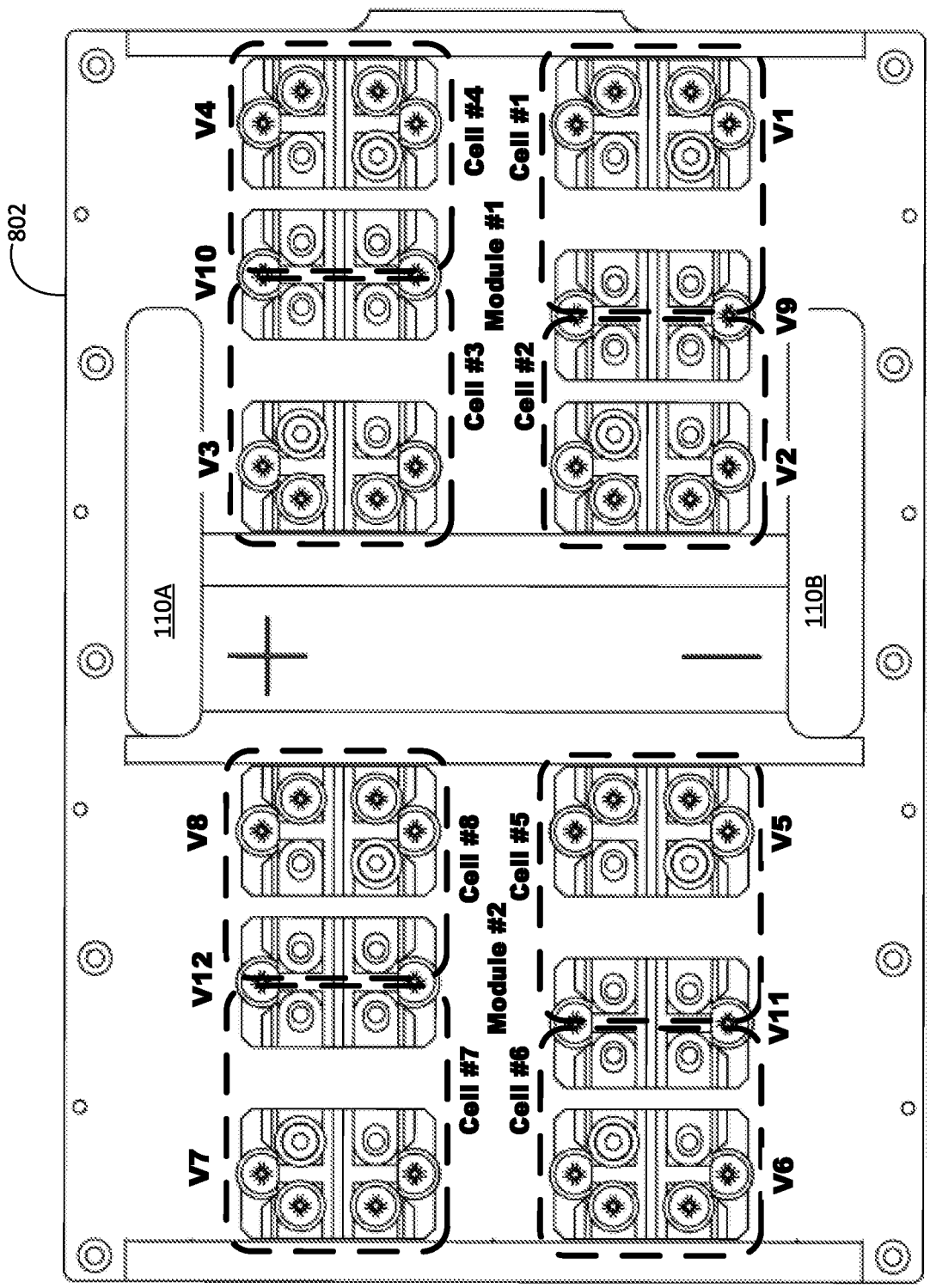
FIG. 2 is a top-view diagram of semiconductor devices of the DC converter.
Figure 3:
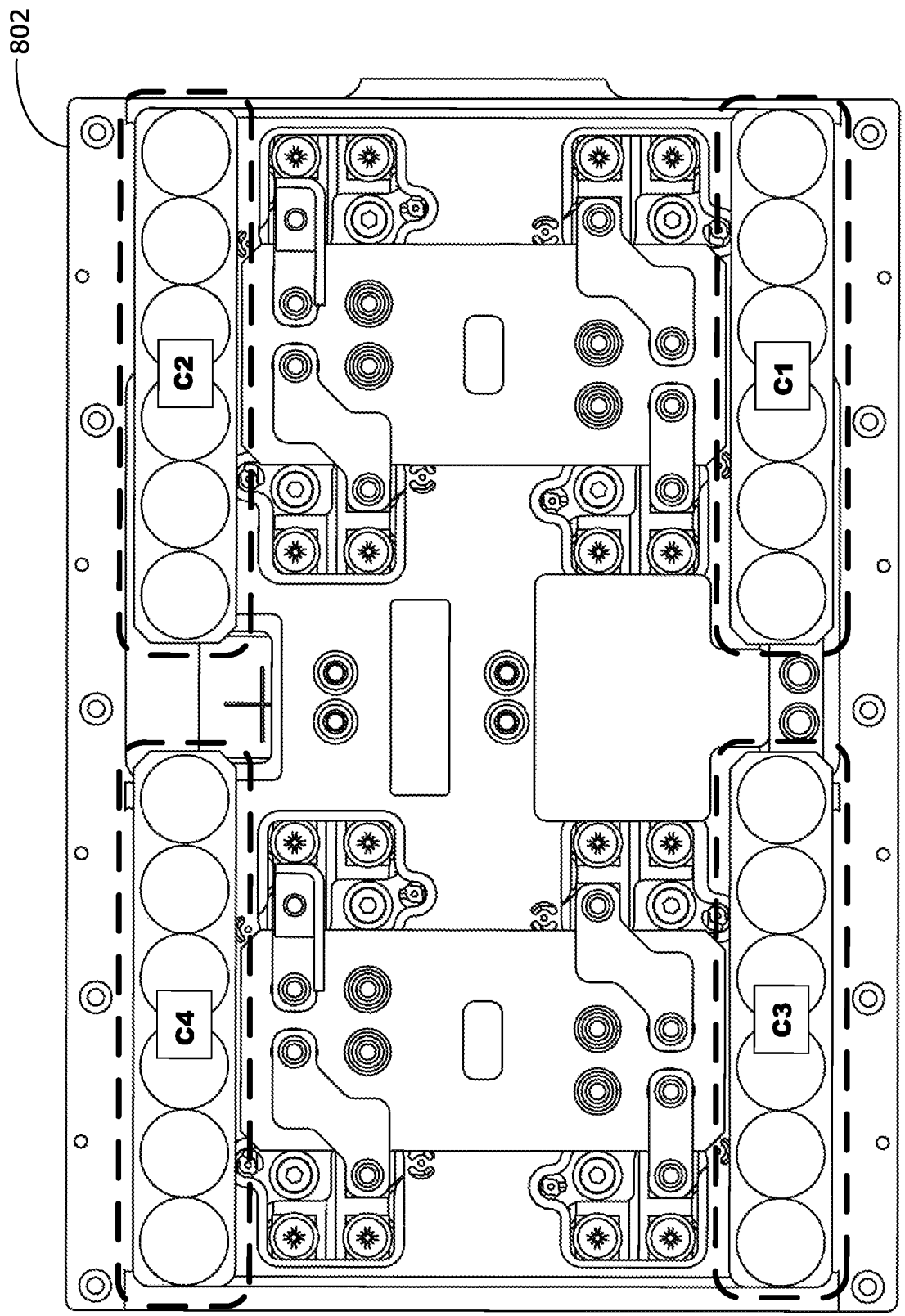
FIG. 3 is a top-view diagram of the DC converter showing capacitor locations.
Figure 4:
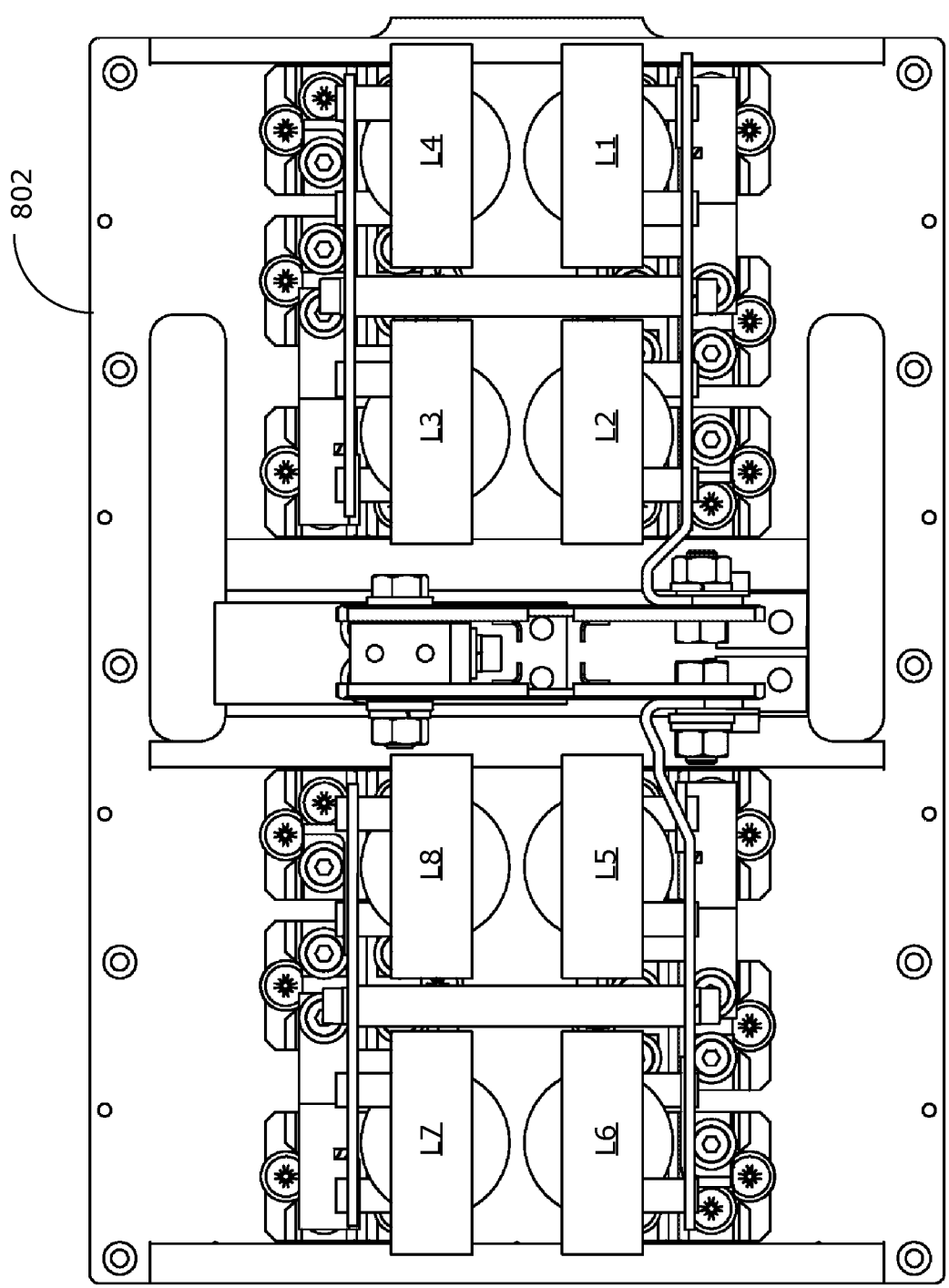
FIG. 4 is a top-view diagram of the DC converter including inductor components.
Figure 5:
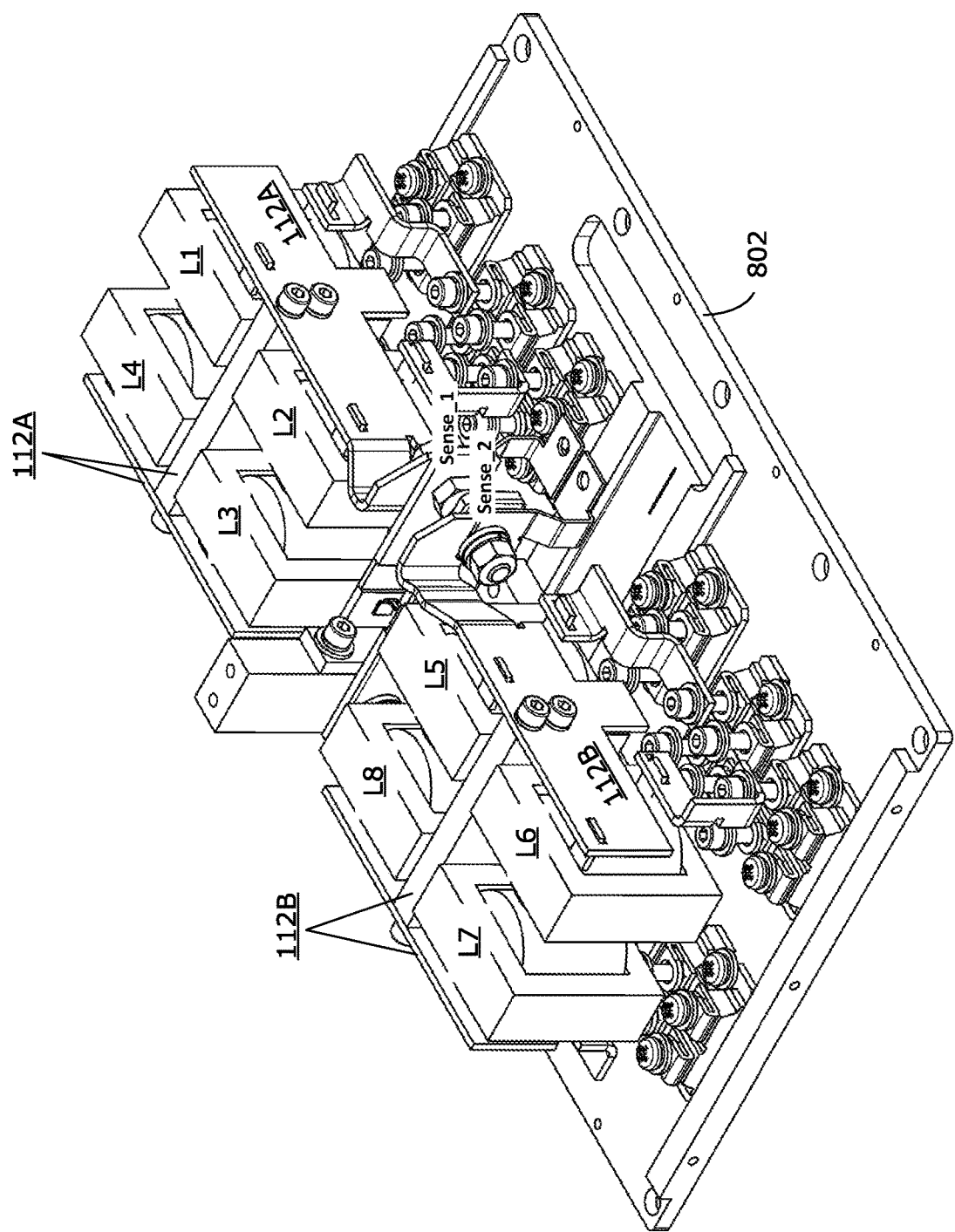
FIG. 5 is a perspective-view diagram of the DC converter including the inductor components.

As shown in FIG. 2, the semiconductor power electronic components for each step-down converter include a power diode and a power transistor for each converter. Each power diode physical package (i.e., the physical package that includes and mounts the power diodes) includes two power diode devices, one of which is used for one step-down converter cell and the other of which is used for the second step-down converter cell in each step-down converter pair. In FIG. 1, the power diodes are labelled V9a, V9b, V10a, V10b, V11a, V11b, V12a and V12b for cells #1 to #8 respectively. Similarly, the power transistors in FIG. 1 are labelled V1 to V8 for cells #1 to #8 respectively. As shown in FIG. 2, the step-down converters are arranged in pairs, namely cells #1 and #2 in a first pair, cells #3 and #4 in a second pair, cells #5 and #6 in a third pair, and cells #7 and #8 in a fourth pair. The step-down converters of each pair share a diode semiconductor device including the power diodes of the pair: diode device V9 includes power diodes V9a and V9b; diode device V10 includes power diodes V10a and V10b, diode device V11 includes the power diodes V11a and V11b, and diode device V12 includes power diodes V12a and V12b. Each of the step-down converters (e.g., cell #1) can be considered to include a transistor device (e.g., V1), a portion of the diode device (e.g., V9a), and an inductor (e.g., L1), as shown in FIG. 1. As shown in FIGS. 2, 4 and 5, the two step-down converters in each pair (e.g., cell #1 and cell #2) are arranged adjacent to each other, with the diode package placed between the power transistors of each step-down converter, and offset from the centre point of the pair as required to allow the interconnections between the power transistors and the power diode of each cell to be achieved.

Each step-down converter is managed by the switching control electronics of the DC converter that generate switching signals for the power transistors V1 to V8. The switching control electronics of the DC converter 102 are configured to control the step-down converters in each pair (e.g., cell #1 and cell #2) such that they are switched a half cycle, i.e., 180 degrees, out of phase to mitigate conducted (i.e., conductive, or non-radiative) electromagnetic interference (EMI) at the odd harmonics of the fundamental switching frequency of the step-down converters. As shown in FIGS. 2, 4 and 5, the step-down converters in each pair are arranged such that they have substantial reflection symmetry in a plane bisecting the pair, specifically the semiconductor power electronic components have substantial reflection symmetry in a plane bisecting the pair. For example, as shown in FIGS. 2 and 4, the pair comprising cell #1 and cell #2 is substantially symmetric about the diode device V9 in terms of the locations of the portions of the diode device V9 in each cell, the locations of the transistor devices V1, V2 in each cell, and the locations of the inductors L1, L2 in each cell.

As shown in FIGS. 2 to 5, two pairs of the step-down converters are arranged to form quads, i.e., each quad includes four step-down converters. The quads are referred to as "module #1" and "module #2" in FIGS. 1 and 2. The physical arrangement of the step-down converter pairs is replicated in each quad, as shown in FIGS. 2 and 4, so that each pair will individually mitigate odd harmonics of their switching frequency as described hereinbefore, and jointly the two pairs will further mitigate EMI at additional harmonics of the fundamental switching frequency. Thus pairs in each quad have translation symmetry, i.e., the relative arrangement of the components in each pair is the same for each pair. The switching control electronics are configured to switch the step-down converters in the first quad out of phase (thus providing a phase difference between the pairs), including by a quarter cycle, i.e., 90 degrees, out of phase with the step-down converters in the other pair, to mitigate conducted (i.e., conductive, or non-radiative) EMI specifically at the 2nd, 6th, 10th, 14th, 18th and so on, harmonics of the fundamental switching frequency, (i.e., at the "2+n4"-th harmonics, or equivalently "2+4n"-th harmonics, where "n" is a non-negative integer).

As shown in FIGS. 1 to 5, two quads of the step-down converters are arranged to form an octet, i.e., eight step-down converters. The physical arrangement of each quad is identical, as shown in FIGS. 2 and 4, so that each quad will individually mitigate harmonics of their switching frequency as described hereinbefore, and jointly the two quads will further mitigate EMI at additional harmonics of the fundamental switching frequency. Thus quads in the octet have translation symmetry, i.e., the relative arrangement of the components in each quad is the same for each quad. The switching control electronics are configured to switch the step-down converters in the first quad out of phase (thus providing a phase difference between the quads), including by an eighth cycle, i.e., 45 degrees, out of phase with the step-down converters in the second quad, to mitigate conducted (i.e., conductive, or non-radiative) EMI specifically at the 4th, 12th, 20th and so on, harmonics of the fundamental switching frequency, (i.e., at the "4+n8"-th harmonics, or equivalently "4+8n"-th harmonics, where "n" is a non-negative integer).

To summarise, the eight step-down converters in FIG. 1 are switched as follows:

in one pair, "cell #1" and "cell #2" are mutually offset by one half cycle (180 degrees), as are the step-down converters in the other pairs (cells #3 and #4 in the second pair, cells #5 and #6 in the third pair, and cells #7 and #8 in the fourth pair);

in one quad, the two pairs ("#1/#2" and "#3/#4") are mutually offset by one quarter cycle (90 degrees), as are the two pairs in the other quad ("#5/#6" and "#7/#8"); and in the octet, the two quads are mutually offset by one eighth of a cycle (45 degrees).

Figure 6:
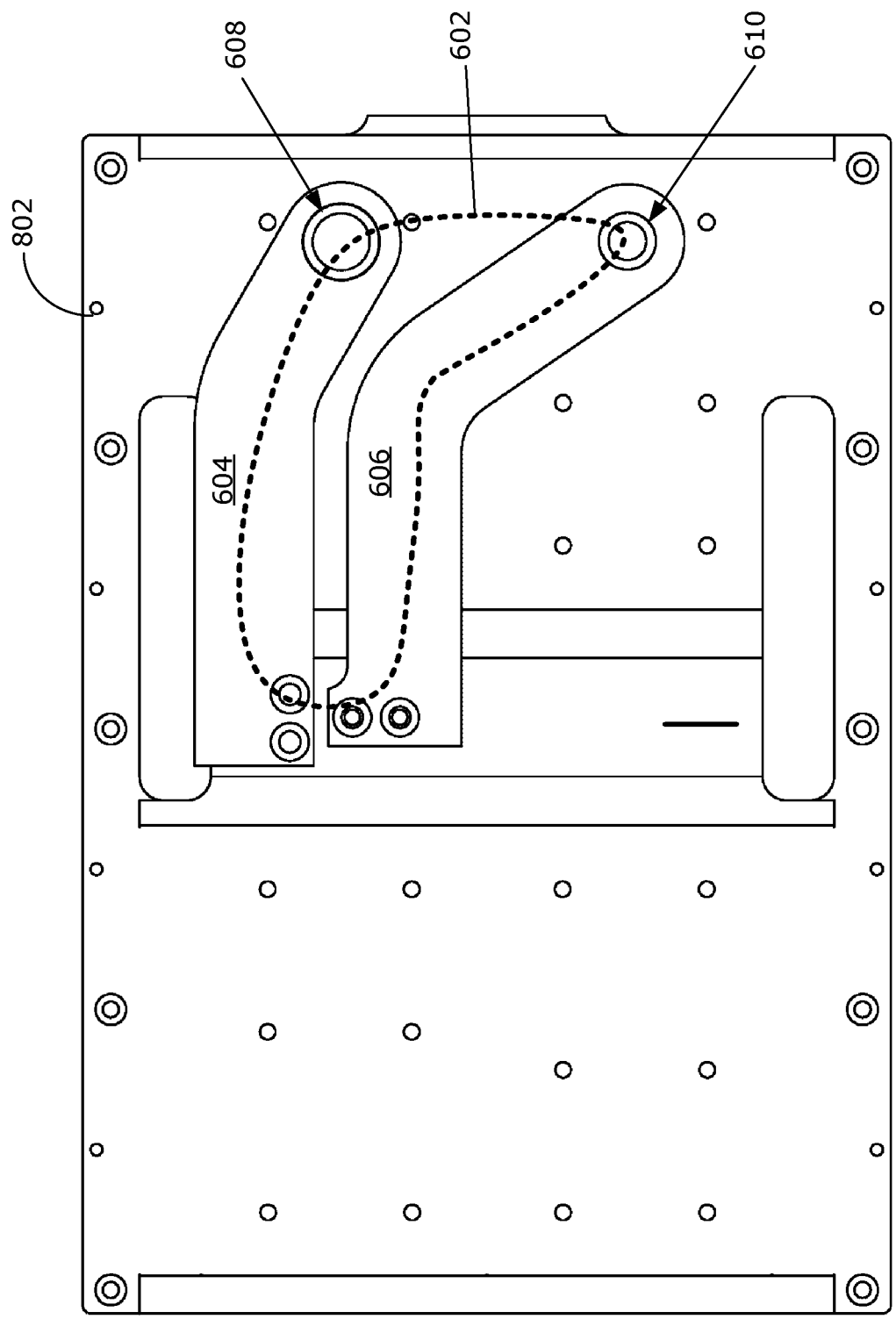
FIG. 6 is a top-view diagram of output conductors of the DC converter extending to DC output terminals for the vehicle.

As shown in FIG. 6, the DC converter includes a loop inductor 602 formed by output conductors 604, 606 extending from the step-down converter output (i.e., the output electrodes of the step-down converters or cells) to DC output terminals 608, 610 for the vehicle. The loop inductor 602 provides a distributed inductance that is represented by two inductor portions labelled "loopout_a" and "loopout_b" in FIG. 1 because the distributed inductance is distributed equally around the circuit loop.

The space between the output conductors 604, 606 is designed (i.e., selected) such that the loop inductor 602 has an inductance value (comprising the inductances of loopout_a and loopout_b) that creates a differential output filter of the DC converter 102, in combination with the output filter capacitors labelled C7 and C8 in FIG. 1, and a common mode output filter in combination with the output filter capacitors labelled C9 and C10 in FIG. 1. The output filter mitigates EMI above the fundamental switching frequency of the DC converter specifically at the harmonic components not cancelled or balanced by the symmetrical arrangements of the step-down converters, that is: at and above the eighth harmonic and sixteenth harmonic components. The output filter is a low-pass filter with a cutoff frequency below, particularly well below (i.e., about a decade below) the first uncancelled harmonic (or first "unbalanced" harmonic), which is the 8th harmonic.

As shown in FIG. 1, the step-down converters are electrically isolated from electrical ground 108, and so the only connection to ground 108 in the DC converter is through capacitors C9 and C10 at the output side of the output loop inductor (comprising loopout_a and loopout_b). Accordingly, the arrangement of the step-down converters in the harmonic-cancelling pairs described hereinbefore, and the selected cutoff frequency of the output filter, strongly mitigate EMI at all or most significant frequencies, including: mitigation of the odd harmonics by the opposite-phase-switched pairs; mitigation of the 2th, 6th, 10th, 14th, 18th and so on (2+4n), harmonics by the quarter-phase switched quads; mitigation of the 4nd, 12th, 20th and so on (4+8n), harmonics by the one-eighth out-of-phase octet; and mitigation of the remaining 8th and above harmonics—including the 8th and 16th—by the output filter including the loop inductor.

As shown in FIG. 2, the DC inputs from the rectifier 106 (at points 110A and 110B in FIG. 1) are symmetrically arranged between the two quads, i.e., in the middle of the octet. The DC input is delivered by copper busbars to the step-down converters. Similarly, the DC outputs from the step-down converters are arranged symmetrically between the inductor components L1 to L8 as shown in FIG. 5; specifically, the busbar forming point 112A in FIG. 1 is formed symmetrically between and about the inductors of the first quad L1 to L4, and the busbar of point 112B in FIG. 1 is formed symmetrically between and about the inductors of the second quad L5 to L8.

The fundamental switching frequency may be between 15 kHz and 50 kHz, including between 25 kHz and 40 kHz, including between 30 kHz and 35 kHz, including at 35 kHz.

Figure 7:
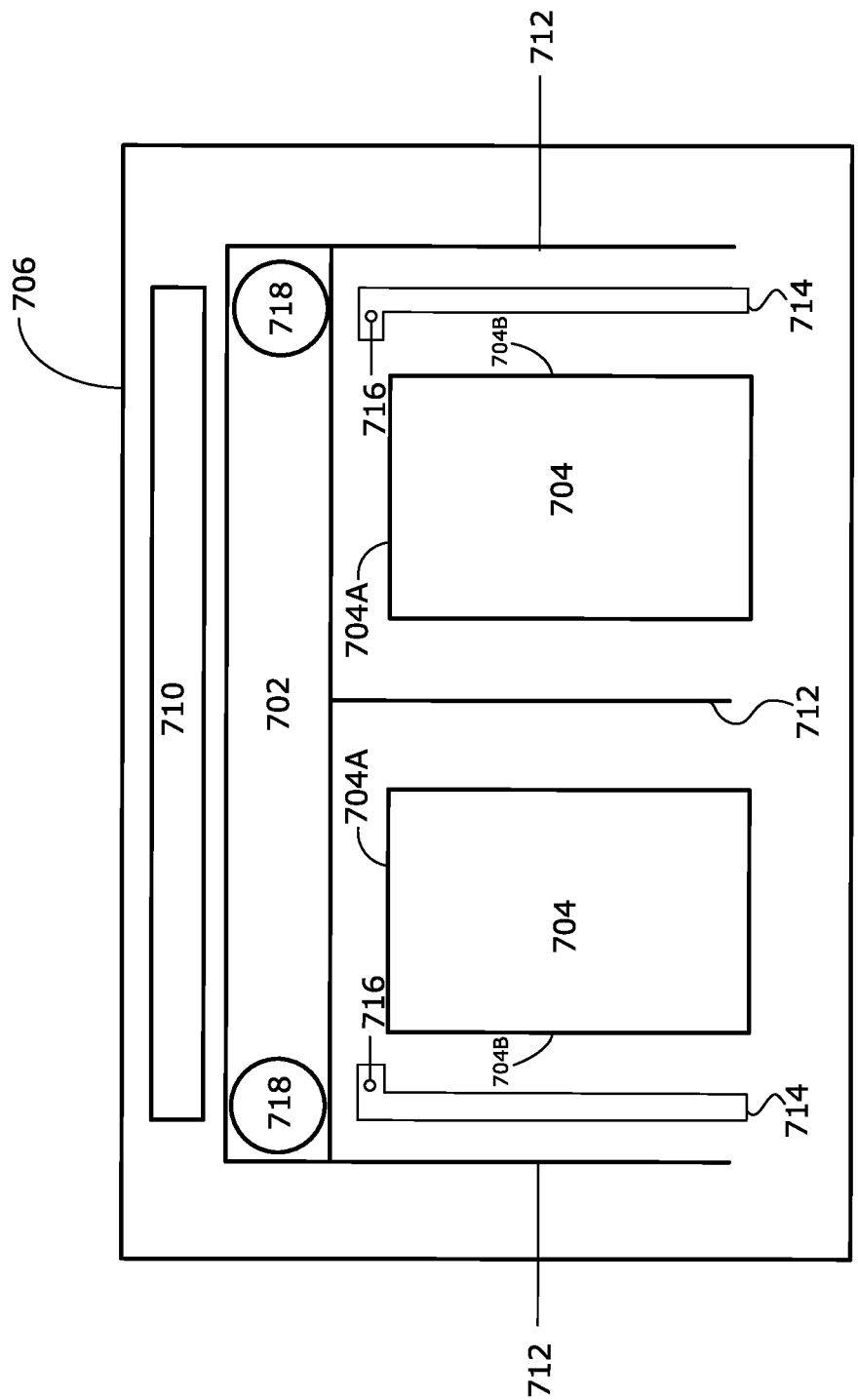
FIG. 7 is a sketch of a liquid cold plate (also referred to as a liquid-cooled plate) in the DC converter.
Figure 8:
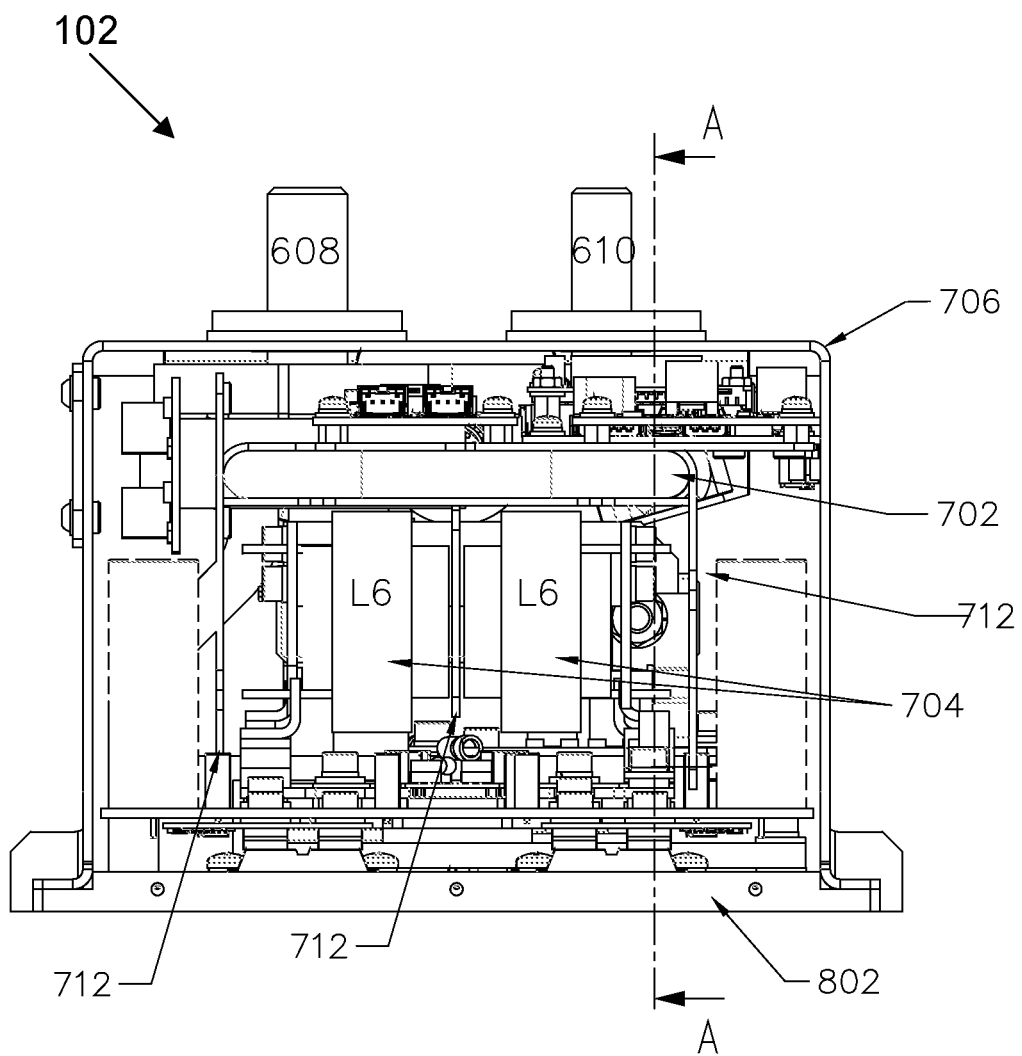
FIG. 8 is a front-view diagram of a liquid-cooled plate in the DC converter.
Figure 9:
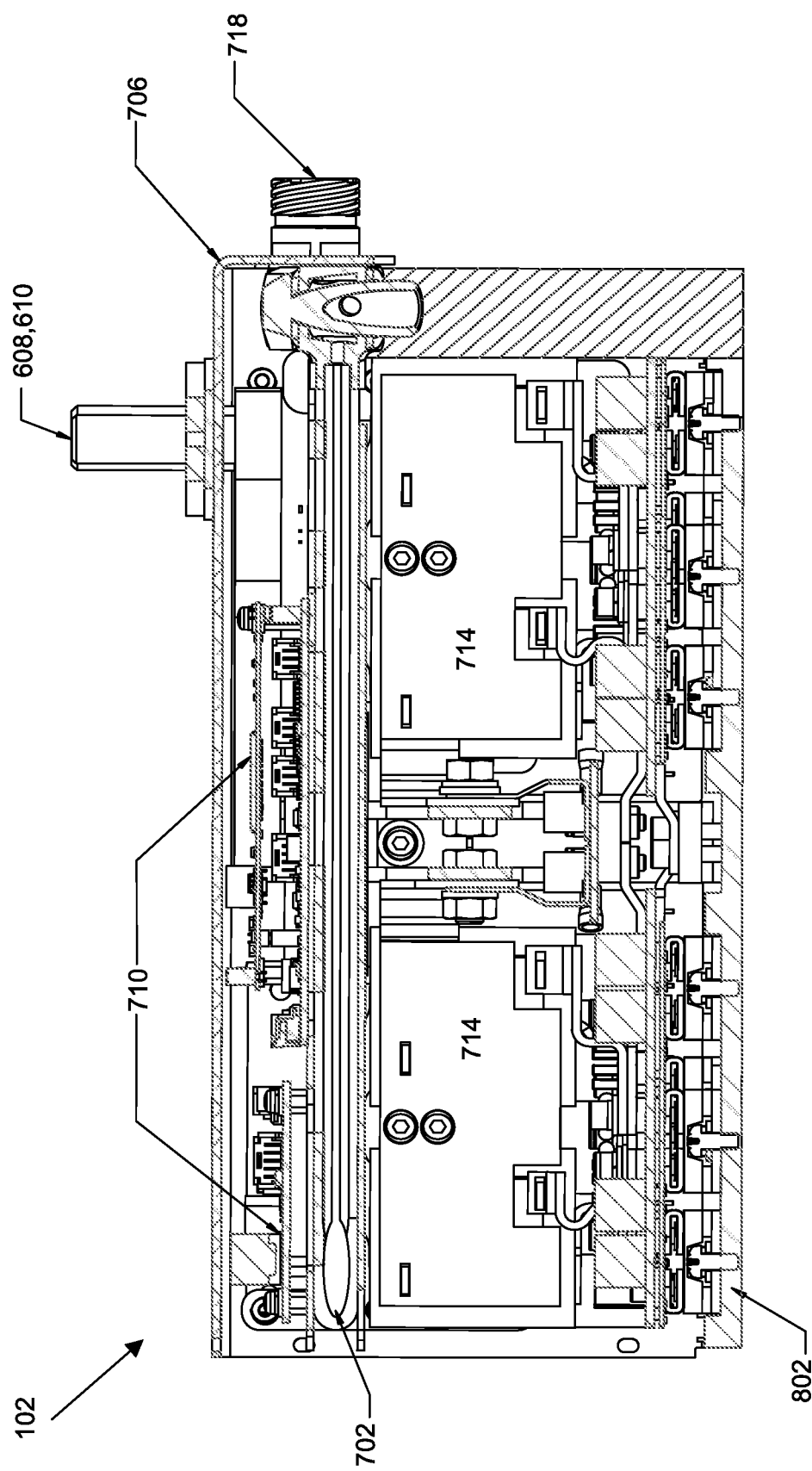
FIG. 9 is a left-side-view diagram of a cross-section along the line A-A in FIG. 8 of the liquid-cooled plate in the DC converter.

As shown in FIGS. 7 to 9, the DC converter includes a liquid cold plate (i.e., a plate that can conduct a liquid that cools the plate by flowing to, from, past and/or through the plate to draw heat out of the plate), also referred to as a "liquid-cooled plate" 702 encased in electronic potting material in a housing 706 of the DC converter 102. As mentioned hereinbefore, each step-down converter includes an inductor component L1 to L8, and these are arranged in the housing 706 and encased in the potting material below the liquid-cooled plate 702 as shown in FIG. 8, with the inductor components labelled "704" in FIGS. 7 and 8. As described hereinbefore, the step-down converters include switching control electronics that control their switching, and these switching control electronics are generally sensitive to temperature, and in certain applications, e.g., high-power applications, need to be protected from heat generated by heat-generating components of the DC converter, e.g., heat-generating components such as the inductor components 704 (L1 to L8). The switching control electronics are labelled "710" in FIGS. 7 and 9 and are separated from the heat-generating inductor components 704 by the liquid-cooled plate 702 so that heat is drawn away from the inductor components 704 before it deleteriously affects the temperature-sensitive switching control electronics 710. The switching control electronics 710 are also encased in the potting material. The liquid-cooled plate 702 also draws heat away from the inductor components 704 themselves, and thus mitigates overheating of the inductor components 704 and the switching electronics 710.

Having the power electronic components and the control electronic components encased in the potted material can improve the vibration tolerance of the DC converter 102. The potting material may be a conventional thermal compound that conducts heat, while being an electrical insulator that does not conduct electricity.

The liquid-cooled plate 702 includes liquid ports 718, as shown in FIGS. 7 and 9, for conducting liquid into and out of the liquid-cooled plate 702 to carry thermal energy out of the DC converter 102. The liquid can be water. The input and output ports can connect to one or more pipes in the liquid-cooled plate 702, e.g., extending around edges of the liquid-cooled plate 702, e.g., in a "U" shaped pipe, and the rest of the liquid-cooled plate 702 can be formed of highly thermally conductive material, including metal, e.g., copper. Alternatively, the ports can connect to a flow chamber in the liquid-cooled plate 702 so that the liquid flows as a sheet in the liquid-cooled plate 702 rather than through pipes encased in the liquid-cooled plate 702, and the flow chamber is then formed by the highly thermally conductive material of the liquid-cooled plate 702.

The liquid-cooled plate 702 can be formed as a simple flat plate with pipes or a cavity for liquid flow, which is less expensive than forming a bespoke aluminium cold plate to mount the particular components, such as the inductor components 704 and/or the control electronic components 710. In this regard, it is noted that the DC converter can include a cold plate 802 with specific liquid-conduction locations corresponding to mounting locations of the switching electronics in the step-down converters, as shown in FIGS. 8 and 9.

As shown in FIGS. 7 to 9, the DC converter includes one or more thermally conductive fins 712 extending in the potting material from the liquid-cooled plate 702 along one or more sides of the inductor components 704 such that each of the inductor components 704 has at least two sides (labelled 704A and 704B in FIG. 7) facing the liquid-cooled plate 702 or the thermally conductive fins 712. The thermally conductive fins 712 can be formed of solid conductive material, including metal, e.g., copper. The thermally conductive fins 712 effectively increase the liquid-cooled plate's thermal surface area facing the inductor components 704. Because the thermally conductive fins 712 do not require internal liquid flow, they can be thinner than the liquid-cooled plate 702, and can have irregular geometric shapes that would not be suitable to include internal fluid flow, e.g., as shown in FIG. 9. The thermally conductive fins 712 are connected to the liquid-cooled plate 702 by a thermally conductive attachment process or adhesive, such as brazing or thermal conductive glue.

As shown in FIG. 7, the DC converter 102 also includes one or more isolated thermally conductive elements 714 between the thermally conductive fins 712 and the inductor component 704 to improve thermal conduction between the inductor component 704, the thermally conductive fins 712 and the liquid-cooled plate 702. The isolated thermally conductive elements 714 are electrically isolated from the thermally conductive fins 712 by the potting material. The isolated thermally conductive elements 714 may be electrically connected to one or more of the inductor components 704. The isolated thermally conductive elements 714 extend longitudinally and generally are parallel to the thermally conductive fins 712. As shown in FIG. 7, the isolated thermally conductive elements 714 each have a proximal end 716 that is adjacent to the liquid-cooled plate 702, and this proximal end 716 has an expanded transverse face relative to middle portions of the isolated thermally conductive element 714 to increase the thermal surface area of the isolated thermally conductive element 714 that faces the liquid-cooled plate 702 while still allowing the middle portions to be thin enough to fit between the thermally conductive fins 712 and the inductor components 704. Having the isolated thermally conductive elements 714 separated from the thermally conductive fins 712 and from the liquid-cooled plate 702, allows for improved flexibility of placement of the isolated thermally conductive elements 714 in the potting material and in between the other components already in the DC converter 102 which are relatively tightly packed, e.g., as shown in FIGS. 8 and 9.

The DC converter operates according to a method that includes switching the step-down converters according to the phase relationships described hereinbefore. The DC converter is formed according to a method that includes:

arranging the plurality of step-down converters electrically in parallel;

arranging the liquid-cooled plate 702 between one or more of the inductor components 704 (L1 to L8) and the switching control electronics 710;

encasing the liquid-cooled plate 702, the inductor component 704 and the switching control electronics 710 in the potting material; and fitting the housing 706 around the electronic components and the thermally conductive components of the DC converter 102.

Implementation

The compact arrangement of the DC converter 102, with close placement of the power electronic components and the control electronic components, allows for operation of the DC converter 102 with the PM alternator 104 in applications that have stringent requirements for limited EMI, in-vehicle space, operating temperature, and/or vibration tolerance, while also requiring high power output to control electrical systems in the vehicle, including at a wide range of vehicle engine speeds. Mitigation of the conducted EMI from the DC converter improves the quality of the DC supply for the in-vehicle electronics, e.g., by reducing electronic noise (e.g., voltage ripple) at the output terminals 608, 610.

In an example implementation, the housing 706 can have approximate dimensions of 300 to 400 millimetres (mm) in height, 200 to 300 mm in width, and 300 to 400 mm in length.

In an example implementation, the output power of the DC converter 102 can be about 5 kW to 40 kW, or 10 kW, at the output terminals 608, 610.

Interpretation

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

The invention claimed is:

1. A direct-current (DC) converter for a permanent-magnet (PM) alternator for a vehicle, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI);
  wherein the two step-down converters in each pair are arranged to be switched a half cycle out of phase by configuration of switching control electronics of the DC converter; and
  wherein the two step-down converters in each pair are physically arranged adjacent to each other to mitigate conducted EMI at odd harmonics of the fundamental switching frequency of the step-down converters.

2. The DC converter of claim 1, wherein each step-down converter has a semiconductor power transistor and a semiconductor power diode arranged such that the semiconductor power diodes are located between the semiconductor power transistors of the two step-down converters in each pair.

3. The DC converter of claim 2, wherein physical interconnections between the semiconductor power diodes and the semiconductor power transistors of the two step-down converters in each pair are arranged to achieve reflection symmetry to reduce odd harmonic circulating currents and thus mitigate odd harmonics of the fundamental switching frequency.

4. A direct-current (DC) converter for a permanent-magnet (PM) alternator for a vehicle, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI), wherein two pairs of the step-down converters are replicated adjacent to each other to form a quad to mitigate conducted EMI at the second, sixth, tenth, fourteenth and/or eighteenth harmonics of the fundamental switching frequency.

5. The DC converter of claim 4, wherein the pairs in each quad have translation symmetry.

6. The DC converter of claim 4, wherein the two pairs of step-down converters in each quad are arranged to be switched out of phase by configuration of switching control electronics of the DC converter, including a quarter cycle out of phase.

7. The DC converter of claim 4, wherein two of the quads are replicated adjacent to each other to form an octet to mitigate the conducted EMI at the fourth, twelfth and/or twentieth harmonics of the fundamental switching frequency.

8. The DC converter of claim 7, wherein the quads in the octet have translation symmetry.

9. The DC converter of claim 4, wherein the step-down converters in each quad are arranged to be switched out of phase between each quad by configuration of the switching control electronics of the DC converter, including an eighth cycle out of phase.

10. A direct-current (DC) converter for a permanent-magnet (PM) alternator for a vehicle, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI), the DC converter further including a loop inductor formed by output conductors extending from the step-down converters to DC output terminals for the vehicle, wherein the loop inductor provides an output filter that mitigates conducted EMI, including at and above the eighth harmonic of the fundamental switching frequency.

11. The DC converter of claim 10, wherein the output filter includes one or more output filter capacitors that cooperate with the loop inductor to provide the output filter.

12. A direct-current (DC) converter for a permanent-magnet (PM) alternator for a vehicle, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI), wherein the step-down converters are electrically isolated from electrical ground at the fundamental switching frequency.

13. A direct-current (DC) converter for a permanent-magnet (PM) alternator for a vehicle, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI), wherein the fundamental switching frequency is between 15 kHz and 50 kHz, between 25 kHz and 40 kHz, between 30 kHz and 35 kHz, or at 35 kHz.

14. A direct-current (DC) converter for a permanent-magnet (PM) alternator for a vehicle, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI), wherein each step-down converter includes an inductor component and switching control electronics encased in potting material, wherein the DC converter includes a liquid cold plate in the potting material between the inductor component and the switching control electronics to mitigate overheating of the inductor component and the switching control electronics.

15. The DC converter of claim 14, including one or more thermally conductive fins extending in the potting material from the liquid cold plate along one or more sides of the inductor component such that the inductor component has at least two sides facing the liquid cold plate or the one or more thermally conductive fins.

16. The DC converter of claim 15, wherein the one or more thermally conductive fins effectively increase the liquid cold plate's thermal surface area facing the inductor component.

17. The DC converter of claim 16, including one or more isolated thermally conductive elements in the potting material between the one or more thermally conductive fins and the inductor component to improve thermal conduction between the inductor component and the liquid cold plate, wherein the one or more isolated thermally conductive elements are electrically isolated from the one or more thermally conductive fins by the potting material.

18. The DC converter of claim 17, wherein the one or more isolated thermally conductive elements extend longitudinally generally parallel to the one or more thermally conductive fins.

19. The DC converter of claim 18, wherein at least one of the one or more isolated thermally conductive elements has a proximal end that is adjacent to the liquid cold plate, and the proximal end has an expanded transverse face relative to middle portions of the at least one of the one or more isolated thermally conductive elements to increase thermal surface area of the at least one of the one or more isolated thermally conductive elements facing the liquid cold plate.

20. A permanent-magnet (PM) alternator for a vehicle, the PM alternator including a direct-current (DC) converter, the DC converter including one or more pairs of step-down converters that are electrically in parallel operating at a fundamental switching frequency, wherein two step-down converters in each pair are arranged to be switched out of phase, and wherein the two step-down converters in each pair are arranged adjacent to each other to mitigate conducted electromagnetic interference (EMI).

21. A method of operating a direct-current (DC) converter for a permanent-magnet (PM) alternator for a vehicle, the DC converter including multiple pairs of step-down converters that are electrically in parallel, wherein two step-down converters in each pair are arranged adjacent to each other, the method comprising: switching the two step-down converters in each pair out of phase to mitigate conducted electromagnetic interference (EMI) in the permanent-magnet (PM) alternator.

* * * * *